(12) United States Patent
Erell

(10) Patent No.: US 6,959,275 B2
(45) Date of Patent: Oct. 25, 2005

(54) SYSTEM AND METHOD FOR ENHANCING THE INTELLIGIBILITY OF RECEIVED SPEECH IN A NOISE ENVIRONMENT

(75) Inventor: Adoram Erell, Herzlia (IL)

(73) Assignee: D.S.P.C. Technologies Ltd. (IL)

( * ) Notice: Subject to any disclaimer, the term of this patent is extended or adjusted under 35 U.S.C. 154(b) by 747 days.

(21) Appl. No.: 09/867,028

(22) Filed: May 30, 2001

(65) Prior Publication Data
US 2002/0019733 A1 Feb. 14, 2002

Related U.S. Application Data

(60) Provisional application No. 60/207,273, filed on May 30, 2000.

(51) Int. Cl.[7] .............................................. G10L 19/00
(52) U.S. Cl. ..................................... 704/225; 704/226
(58) Field of Search .............................. 704/225, 226, 704/270.1, 224

(56) References Cited

U.S. PATENT DOCUMENTS

| | | | |
|---|---|---|---|
| 5,890,109 A | 3/1999 | Walker et al. | |
| 5,903,819 A | 5/1999 | Romesburg | |
| 5,907,823 A | 5/1999 | Sjoberg et al. | |
| 5,978,756 A | 11/1999 | Walker et al. | |
| 6,212,273 B1 | 4/2001 | Hemkumar et al. | |
| 6,262,943 B1 | 7/2001 | Clarke | |
| 6,535,846 B1 * | 3/2003 | Shashoua | 704/225 |
| 6,708,146 B1 * | 3/2004 | Sewall et al. | 704/217 |
| 6,754,337 B2 * | 6/2004 | Domer et al. | 379/388.05 |
| 2001/0012997 A1 | 8/2001 | Erell | |
| 2002/0019733 A1 | 2/2002 | Erell | |
| 2002/0077813 A1 | 6/2002 | Erell | |
| 2003/0002659 A1 | 1/2003 | Erell | |
| 2003/0004712 A1 | 1/2003 | Erell | |

FOREIGN PATENT DOCUMENTS

| | | |
|---|---|---|
| EP | 0 600 164 | 6/1994 |
| EP | 0 763 888 A2 | 3/1997 |
| WO | WO 00/60830 | 10/2000 |

OTHER PUBLICATIONS

Schneider, A., et al., "An adaptive dynamic range controller for digital audio", *IEEE/Communications, Computers and Signal Processing*, pp. 339–342, May 1991 (XP010039446).

* cited by examiner

*Primary Examiner*—Daniel Abebe
(74) *Attorney, Agent, or Firm*—Fish & Richardson P.C.

(57) ABSTRACT

Based on an automatic gain factor derived from a long term peak value sample is a frame of a received signal containing speech are adjusted to enhance intelligibility. A dynamic range compression algorithm may also be used to further enhance intelligibility.

16 Claims, 4 Drawing Sheets

SYSTEM AND METHOD FOR ENHANCING THE INTELLIGIBILITY OF RECEIVED SPEECH IN A NOISE ENVIRONMENT

RELATED APPLICATIONS

This application claims the benefit of the filing date of U.S. provisional patent application Ser. No. 60/207,273, filed on May 30, 2000.

FIELD OF THE INVENTION

The present invention relates generally to audio communication devices, and specifically to intelligibility enhancement of speech received by a communications device.

BACKGROUND

Receiving and understanding a voice communication received using a communications device while in a noise environment is problematic. Ambient or background noise near the receiver, the near-end, may at times approach or exceed the volume levels of the received speech causing a listener to be unable to understand the message.

Simply increasing the volume of the received speech is not very effective in increasing the intelligibility of the speech. Speech amplitude levels fluctuate throughout a sentence, from word to word, and even from syllable to syllable. Increasing the volume to compensate for a low amplitude portion of the speech may cause the receiver to clip when a high amplitude portion of the speech is received. Adjusting the volume to compensate for a high amplitude portion may render a subsequent portion having a low amplitude unintelligible.

U.S. Pat. No. 5,907,823 describes a dynamic range compression method which based on an instantaneous measurement of a received speech level or amplitude and an estimate of the ambient and far-end noise levels adjusts the received signal to enhance intelligibility. FIG. 1 shows a system according to the '823 patent. The dynamic range compression module receives (1) the received speech signal, (2) a signal indicating an estimate of the far-end noise level, and (3) a signal indicating an estimate of the near-end or ambient noise level. The dynamic range compression module performs a transform of the received speech according to the transform pattern shown in FIG. 2.

Several drawback in the prior art systems exist which poorly address the issue of rapid variations in speech volume and very low speech levels.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings in which:

Figure 1:
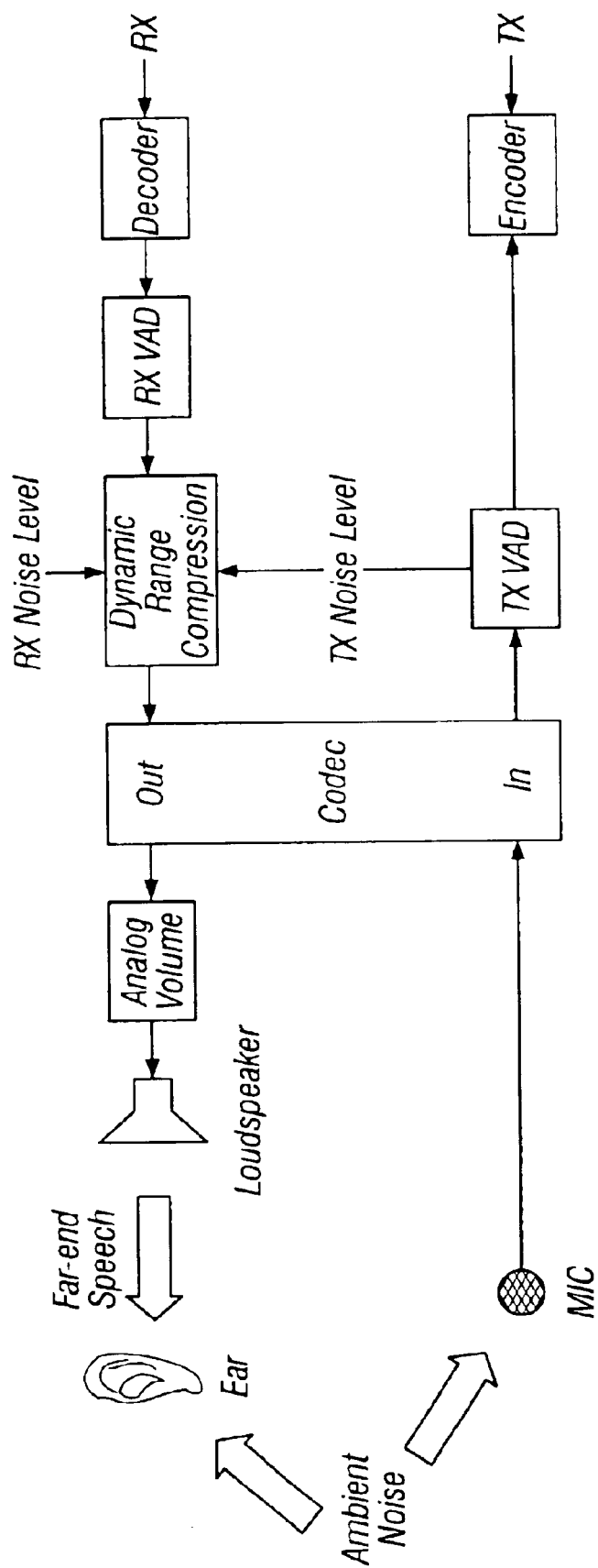
FIG. 1 is a block diagram showing a speech intelligibility enhancement system according to the prior art.
Figure 2:
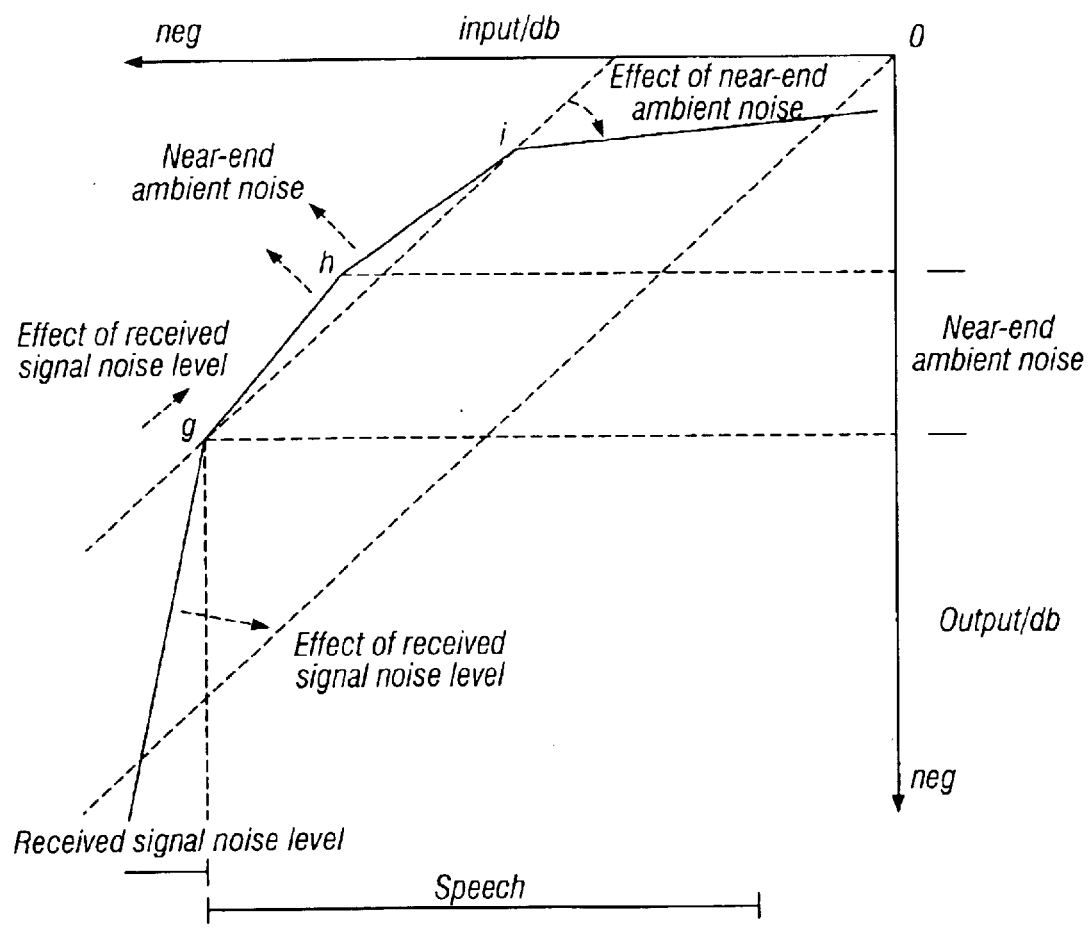
FIG. 2 is a graph showing the transform function or pattern of the system in FIG. 1.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

DETAILED DESCRIPTION

In the following detailed description, numerous specific details are set forth in order to provide a thorough understanding of the invention. However, it will be understood by those skilled in the art that the present invention may be practiced without these specific details. In other instances, well-known methods, procedures, components and circuits have not been described in detail so as not to obscure the present invention.

Unless specifically stated otherwise, as apparent from the following discussions, it is appreciated that throughout the specification discussions utilizing terms such as "processing", "computing", "calculating", "determining", or the like, refer to the action and/or processes of a computer or computing system, or similar electronic computing device, that manipulate and/or transform data represented as physical, such as electronic, quantities within the computing system's registers and/or memories into other data similarly represented as physical quantities within the computing system's memories, registers or other such information storage, transmission or display devices.

Embodiments of the present invention may include apparatuses for performing the operations herein. This apparatus may be specially constructed for the desired purposes, or it may comprise a general purpose computer selectively activated or reconfigured by a computer program stored in the computer. Such a computer program may be stored in a computer readable storage medium, such as, but is not limited to, any type of disk including floppy disks, optical disks, CD-ROMs, magnetic-optical disks, read-only memories (ROMs), random access memories (RAMs) electrically programmable read-only memories (EPROMs), electrically erasable and programmable read only memories (EEPROMs), magnetic or optical cards, or any other type of media suitable for storing electronic instructions, and capable of being coupled to a computer system bus.

The processes and displays presented herein are not inherently related to any particular computer or other apparatus. Various general purpose systems may be used with programs in accordance with the teachings herein, or it may prove convenient to construct a more specialized apparatus to perform the desired method. The desired structure for a variety of these systems will appear from the description below. In addition, embodiments of the present invention are not described with reference to any particular programming language. It will be appreciated that a variety of programming languages may be used to implement the teachings of the inventions as described herein.

As part of the present invention, a received signal containing speech may be divided into frames having some predefined number of samples. A frame may then be analyzed to determine an instantaneous peak value, and from the instantaneous peak values of two or more consecutive frames, a long term peak value may be determined for each frame. For a given frame, an automatic gain control ("AGC") value may be calculated in relation to the difference between a desired volume or amplitude level and the frame's long term peak value. A noise factor between 0 and 1 may be factored into the AGC value. The samples within a frame may be increased or adjusted by the AGC value.

A dynamic range compression ("DRC") gain value may be calculated for each frame and the samples within the frame may be adjusted by the RDC gain value. A noise factor may also me factored into the DRC gain value. The DRC gain value for a frame may be calculated as the difference between the frame's long term peak value and its instantaneous peak value, multiplied by a maximum gain value divided by ΔL, where ΔL, is a range value.

A target gain value for a frame, which is the sum of the frame's AGC and RDC gains, may be smoothed from frame to subsequent frame. One method of smoothing is to average a frame's calculated target gain with the previous frame's target gain value.

Figure 3:
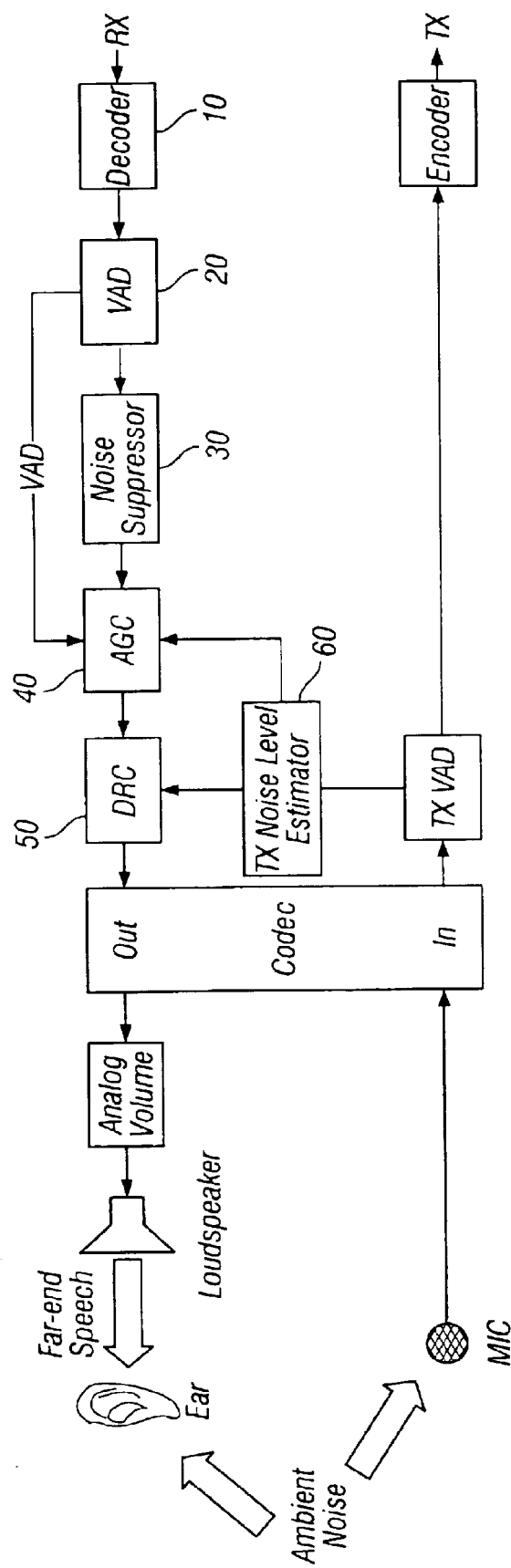
FIG. 3 is a block diagram showing a speech intelligibility enhancement system according to the present invention.

Turning now to FIG. 3, there is shown a system according to the present invention. A received signal RX is decoded by decoder 10 and speech within the signal is detected by a voice activity detector 20. A noise suppressor 30 may remove noise from the signal and pass the signal to the AGC unit 40. The AGC unit 40 may compute an AGC gain value and apply the value to the signal, and the DRC unit 50 may also compute and apply a DRG gain value to the signal. Both the AGC 40 and the DRC 50 may receive a signal from a TX noise estimator 60 indicating an estimate of the noise on the receiver or near side.

Figure 4:
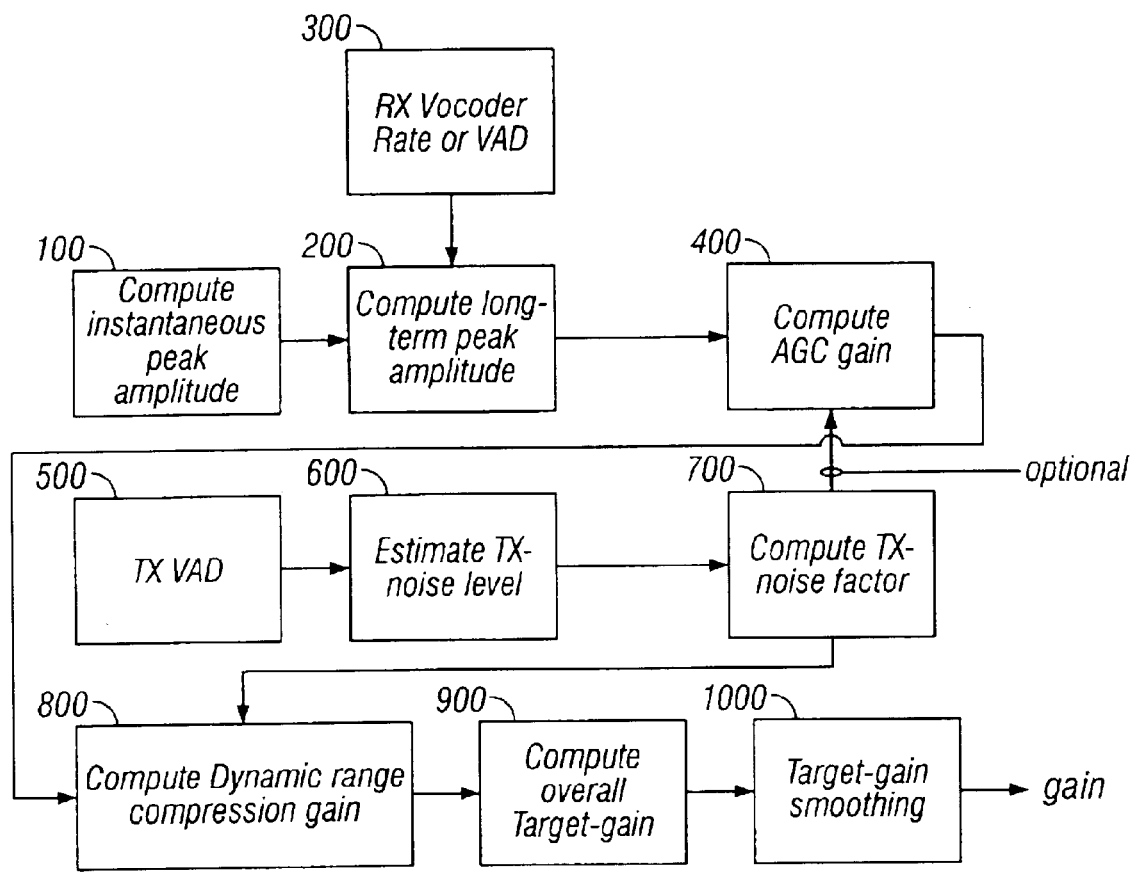
FIG. 4 is a flow diagram showing the steps performed by a speech intelligibility enhancement system according to the present invention.

FIG. 4 is a flow diagram showing the steps performed by a speech intelligibility enhancement system according to the present invention. For each frame of a received signal an instantaneous peak amplitude or value is computed as part of step 100. The size of a frame may vary (e.g. 0.1 to 100 ms). The instantaneous peak amplitude is simple the highest absolute value of any sample in the frame in dB:

instantaneous peak amplitude=20*log(max(abs(x[n])))

As part of step 200, a long term peak amplitude value is calculuted for a frame having speech present therein. Step 300 shows that speech presence in a frame may be indicated by a flag determined either by a voice activity detection algorithm for a fixed-rate vocoder, or by the vocoder rate being maximal for a variable rate vocoder. A frame's long term peak amplitude value may be determined using the following logic:

If(voice present)
  If(instantaneous peak value>long term peak amplitude value)
    long term peak amplitude value=instantaneous peak value
  Else if(instantaneous peak value>Minimum Acceptable Value)
    long term peak amplitude value=long term peak amplitude value−decrement peak value The decrement peak value is chosen to decrease the long term peak amplitude value by a nominal amount.

As part of step 400 an AGC gain value is calculated. The AGC gain may be calculated by subtracting from a target or desired level value L1 the frame's long term peak amplitude value. In one embodiment of the present invention the calculated AGC gain may also be multiplied by a TX noise factor calculated as part of steps 500, 600 and 700.

A DRC gain value is computed as part of step 800. The DRC gain may be computed as the difference between a frame's long term peak value and its instantaneous peak value, multiplied by a maximum gain value divided by ΔL:

DRC gain value=(long term peak value−instantaneous peak value)×Max DRC Gain/ΔL,

Where ΔL is a range value typically 20 dB and Max RDC gain is also typically 20 dB. The DRC gain value may also be multiplied by a noise factor such as the one calculated in steps 500, 600 and 700.

A target gain value may be calculated in step 900. The target gain value may be the sum of the AGC and RDC gain values. Smoothing of the computed target gain is performed in step 1000. Each sample in each frame may be adjusted by the smoothed target gain value.

While certain features of the invention have been illustrated and described herein, many modifications, substitutions, changes, and equivalents will now occur to those skilled in the art. It is, therefore, to be understood that the appended claims are intended to cover all such modifications and changes as fall within the true spirit of the invention. A description of a second embodiment is attached as Appendix A.

What is claimed:

1. A method for enhancing intelligibility of speech within a received speech signal comprising:
    adjusting the amplitude of samples within a frame of the signal by an automatic gain factor derived a long term peak value; and
    adjusting the amplitude of the samples within a frame of the signal by a dynamic range compression gain factor correlated to a noise factor.

2. The method according to claim 1, wherein the automatic gain factor is correlated to a noise factor.

3. The method according to claim 1, wherein the automatic gain factor is related to the difference between a constant level value and the long term peak value.

4. The method according to claim 1, wherein the dynamic compression gain factor is related to the difference between a long term peak value and an instantaneous peak value.

5. The method according to claim 4, wherein the dynamic compression ("DRC") gain factor is adjusted in proportion to a maximum DRC gain value divided by a range value.

6. The method according to claim 1, further comprising adjusting the amplitude of samples within a second consecutive frame using a target gain factor, wherein a target gain factor is defined as the sum of a frame's automatic gain factor and DRC gain factor.

7. The method according to claim 6, further comprising smoothing the target gain factor.

8. The method according to claim 7, wherein smoothing of the second target gain factor is performed by taking an average between the target gain factors of the first and second frames.

9. A computer readable medium for enhancing intelligibility of speech within a received speech signal comprising instructions when executed by a processor cause said processor to:
    adjust the amplitude of samples within a frame of the signal by an automatic gain factor derived a long term peak value; and
    adjust the amplitude of the samples within a frame of the signal by a dynamic range compression gain factor correlated to a noise factor.

10. The computer readable medium of claim 9, further comprising instructions which when executed cause the processor to adjust the automatic gain factor in relation to a noise factor.

11. The computer readable medium of claim 10, further comprising instructions which when executed cause the processor to adjust the automatic gain factor in relation to the difference between a constant level value and the long term peak value.

12. The computer readable medium of claim 9, further comprising instructions when executed cause the processor to calculate the dynamic compression gain factor in relation to the difference between a long term peak value and an instantaneous peak value.

13. The computer readable medium of claim 12, further comprising instructions when executed cause the processor to adjust the dynamic compression ("DRC") gain factor in proportion to a maximum DRC gain value divided by a range value.

14. The computer readable medium of claim 9, further comprising instructions when executed cause the processor to adjust the amplitude of samples within a second consecutive frame using a target gain factor, wherein a target gain factor is defined as the sum of a frame's automatic gain factor and DRC gain factor.

15. The computer readable medium of claim 14, further comprising instructions when executed cause the processor to smooth the target gain factor.

16. The computer readable medium of claim 15 further comprising instructions when executed cause the processor to smooth the second target gain factor by taking an average between the target gain factors of the first and second frames.

* * * * *